United States Patent [19]

Nakahara

[11] Patent Number: 5,498,118

[45] Date of Patent: Mar. 12, 1996

[54] APPARATUS FOR AND METHOD OF CARRYING A SUBSTRATE

[75] Inventor: Kanefumi Nakahara, Yokohama, Japan

[73] Assignee: Nikon Corporation, Tokyo, Japan

[21] Appl. No.: 486,507

[22] Filed: Jun. 7, 1995

Related U.S. Application Data

[63] Continuation of Ser. No. 12,749, Feb. 3, 1993, abandoned.

[30] Foreign Application Priority Data

Feb. 7, 1992 [JP] Japan .................................. 4-022618

[51] Int. Cl.⁶ .................................................. B65G 47/91
[52] U.S. Cl. ...................... 414/416; 414/222; 414/752; 414/936
[58] Field of Search .................................. 414/222, 225, 414/331, 416, 609, 744.2, 744.3, 744.4, 752, 936; 901/16, 40

[56] References Cited

U.S. PATENT DOCUMENTS

| | | | |
|---|---|---|---|
| 4,529,353 | 7/1985 | Dean et al. | 414/225 X |
| 4,539,695 | 9/1985 | La Fiandra | 414/222 X |
| 4,643,629 | 2/1987 | Takahashi et al. | 414/222 X |
| 4,695,215 | 9/1987 | Jacoby et al. | 414/225 |
| 4,752,898 | 6/1988 | Koenig | 414/936 X |
| 4,760,429 | 7/1988 | O'Connor | 355/77 |
| 4,778,331 | 10/1988 | Kimata et al. | 414/752 X |
| 4,787,800 | 11/1988 | Sane et al. | 414/222 |
| 4,818,169 | 4/1989 | Schram et al. | 414/225 X |
| 4,824,309 | 4/1989 | Kakehi et al. | 414/222 X |
| 4,907,931 | 3/1990 | Mallory et al. | 414/936 X |
| 4,917,556 | 4/1990 | Stark et al. | 414/222 X |
| 4,984,953 | 1/1991 | Nakazato et al. | 414/225 X |
| 4,985,722 | 1/1991 | Ushijima et al. | 414/225 X |
| 4,995,063 | 2/1991 | Enoki et al. | 414/225 X |
| 5,059,079 | 10/1991 | Foulke et al. | 901/35 X |
| 5,061,144 | 10/1991 | Akimoto et al. | 414/225 |
| 5,183,370 | 2/1993 | Cruz | 414/752 X |

FOREIGN PATENT DOCUMENTS 62-195143  8/1987  Japan .

*Primary Examiner*—Michael S. Huppert
*Assistant Examiner*—James W. Keenan
*Attorney, Agent, or Firm*—Shapiro and Shapiro

[57] ABSTRACT

An apparatus for carrying a substrate having a substrate storage part for storing substrate casings that encase substrates, and a carrier system for carrying the substrate to a substrate stage from the substrate storage part. The apparatus comprises a first carrier device, a temporary storage part and a second carrier device. The first carrier device carries the substrate to a first substrate carry position from the substrate storage part. The temporary storage unit incorporates a holding mechanism for individually adsorptively holding the substrate by vacuum in a predetermined state and is provided between the first substrate carry position and the substrate stage. The second carrier device is capable of carrying the substrate to the substrate stage from the first carry position and also carrying the substrate between the temporary storage unit and the substrate stage.

8 Claims, 7 Drawing Sheets

APPARATUS FOR AND METHOD OF CARRYING A SUBSTRATE

This is a continuation of application Ser. No. 08/012,749 filed Feb. 3, 1993, now abandoned.

BACKGROUND OF THE INVENTION

1. Field of the Invention

The present invention relates generally to an apparatus for and method of carrying a substrate and, more particularly, to a substrate carrying apparatus and method for use with a semiconductor manufacturing system or a system for manufacturing a substrate for a liquid crystal.

2. Related Background Art

Figure 7:
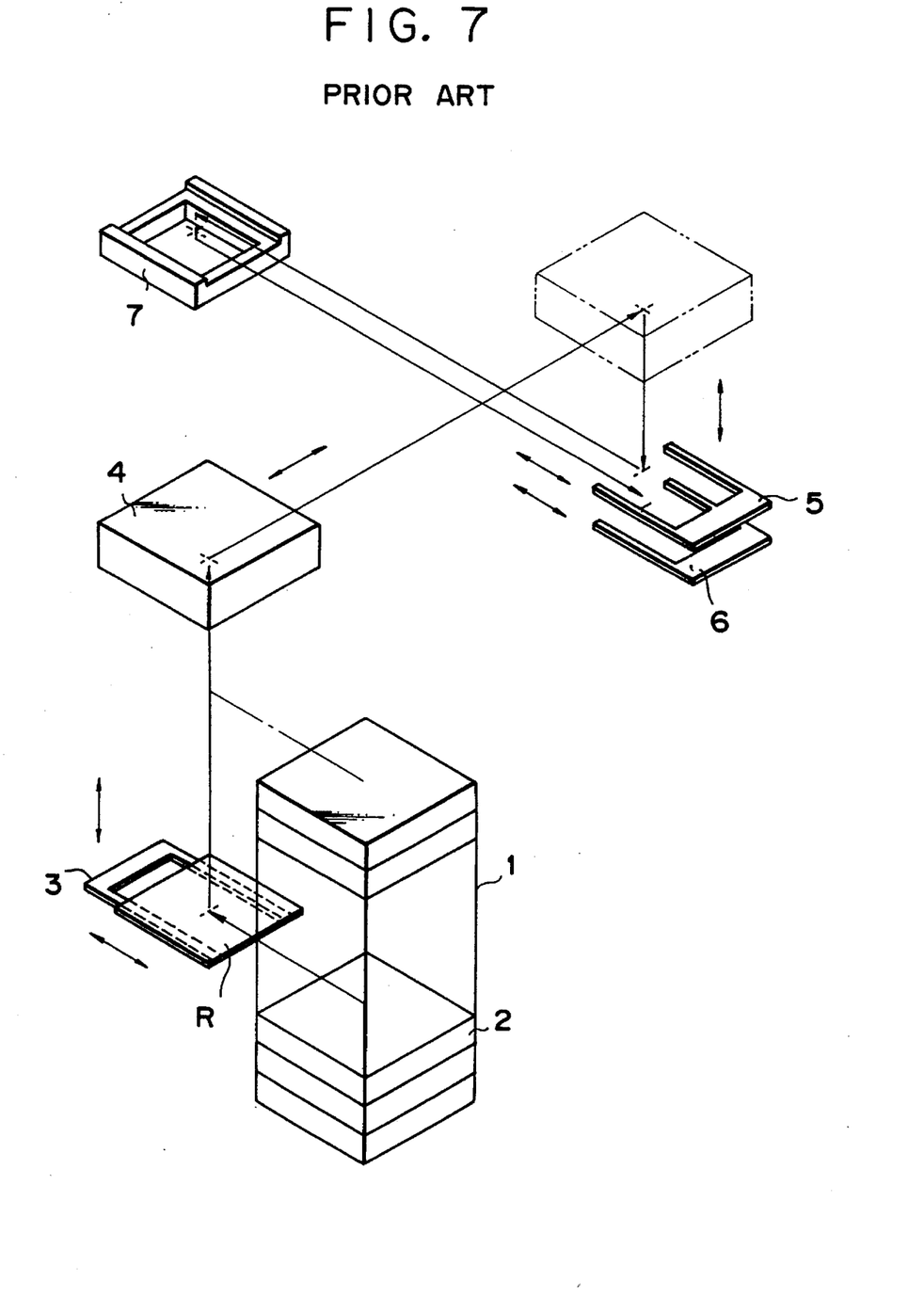
FIG. 7 is a view illustrating a conventional carrying apparatus.

FIG. 7 illustrates this type of conventional apparatus. A carry by the apparatus shown in FIG. 7 is conducted as follows. A substrate storage part 1 is for storing a plurality of substrate casings 2 for encasing substrates R. The substrate R is stored in each casing. The substrate R is taken out of the substrate casing 2 by means of a carrier arm 3 and delivered to a carrier 4. The carrier 4 incorporates a prealignment mechanism. The substrate R is aligned to assume a predetermined state with respect to a carry target position. The prealignment mechanism consists of, e.g., four openable/closable pawl members. The substrate R is caught by the four pawl members, thereby effecting the prealignment. A fiducial position of the substrate R is determined by impinging surfaces of the four pawl members at that time.

The aligned substrate R is delivered to a load arm 5. Thereafter, the load arm 5 carries the substrate R to a reticle table 7. The substrate R that has completely undergone an exposure is delivered by an unload arm 6 to a carrier 4 from the reticle stage 7. Then, the substrate R is returned to a substrate storage part 1 in procedures reversed to the above-mentioned. With the operations described above, the substrate R is carried between the substrate storage part 1 and the reticle table 7. This type of apparatus is disclosed fully in Japanese Patent Application Laid-Open No. 62-195143.

Another practice is that some of a plurality of arms serve as temporary standby locations.

In the prior art discussed above, other sorts of substrates R required in one lot are stored in the substrate storage part 1 while being encased in the substrate casings 2. A position of the substrate R is not fixedly held (fixed) in the substrate casing 2. Exposing involves a step of effecting a prealignment each time (herein, a step through the carrier 4). Consequently, there arises such a problem that a carry route elongates correspondingly, and it is therefore impossible to reduce a substrate replacement cycle time.

Further, in the method where some of the carrier arms serve as the temporary standby locations, if there are large numbers of substrates to be repeatedly replaced, the substrates are returned to the aforementioned substrate storage part 1. Another substrate is required to be taken out of the substrate storage part 1 and carried to the temporary standby location. For this reason, a problem is caused, wherein a great number of substrates repeatedly replaceable in a short substrate replacement cycle can not be obtained.

Moreover, when the same number of carrier arms as that of the substrates R to be replaced are disposed in side by side relationship, the arms need a large space, and the whole apparatus becomes complicated. A moving distance of the carrier arm increases when loading and unloading the substrate R. This results in a decline in throughput of carrying the substrates. Under such circumstances, there exists a problem in which the number of the carrier arms can not be increased.

SUMMARY OF THE INVENTION

It is a primary object of the present invention to provide an apparatus for and a method of carrying a substrate that are capable of reducing a replacement cycle time with an omission of a prealignment step as well as shortening a carry route for replacement of a substrate.

It is another object of the present invention to provide an apparatus for and method of carrying a substrate that are capable of replacing a plurality of substrates in a short replacement cycle time.

It is still another object of the present invention to provide an apparatus and method of carrying a substrate that are capable of carrying a substrate with no positional deviation.

To accomplish the objects given above, according to one aspect of the invention, there is provided an apparatus for carrying a substrate having: a substrate storage part for storing substrate casings that encase substrates; and a carrier system for carrying the substrates to a substrate stage from the substrate storage part, the apparatus comprising: a first carrier means for carrying a substrate to a first substrate carry position from the substrate storage part; a temporary storage unit incorporating a holding mechanism for individually adsorptively holding the substrate by vacuum in a predetermined state and provided between the first substrate carry position and the substrate stage; and a second carrier means capable of carrying the substrate to the substrate stage from the first carry position and also carrying the substrate between the temporary storage unit and the substrate stage.

According to another aspect of the invention, there is provided a substrate carrying apparatus for carrying a substrate to a substrate stage, comprising: a substrate storage part incorporating a holding mechanism for individually adsorptively holding the substrate by vacuum in a predetermined state; and a carrier means, capable of carrying the substrate to the substrate stage from the substrate storage part while adsorptively holding the substrate by vacuum, for carrying the substrate while keeping a position of the substrate on the substrate stage.

According to still another aspect of the invention, there is provided a substrate carrying method of carrying a substrate between a substrate storage part for storing the substrate and a substrate stage for locating the substrate in a predetermined fiducial position, the method comprising: a first step of carrying a substrate to the substrate storage part from the substrate stage; a second step of carrying the substrate to the substrate stage from the substrate storage part; a third step of obtaining an offset quantity on a position of the substrate on the substrate stage from the fiducial position on the basis of the first and second steps; and a fourth step of altering a relative position of the substrate stage to the carrier means in accordance with the offset quantity before the substrate is carried to the substrate stage.

According to the present invention, the temporary storage unit is installed in relatively close proximity to a carry target position separately from the substrate storage part, whereby a carry time can be reduced.

Further, each substrate can be directly adsorptively held in the temporary storage unit. Therefore, the substrate that has been once aligned has no positional deviation. For this reason, the substrate can be carried between the temporary storage unit and the substrate stage without passing through the prealignment step.

In addition, if the storage part incorporates a partial air-conditioning function, a clean storage with no dust can be attained.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

Figure 1:
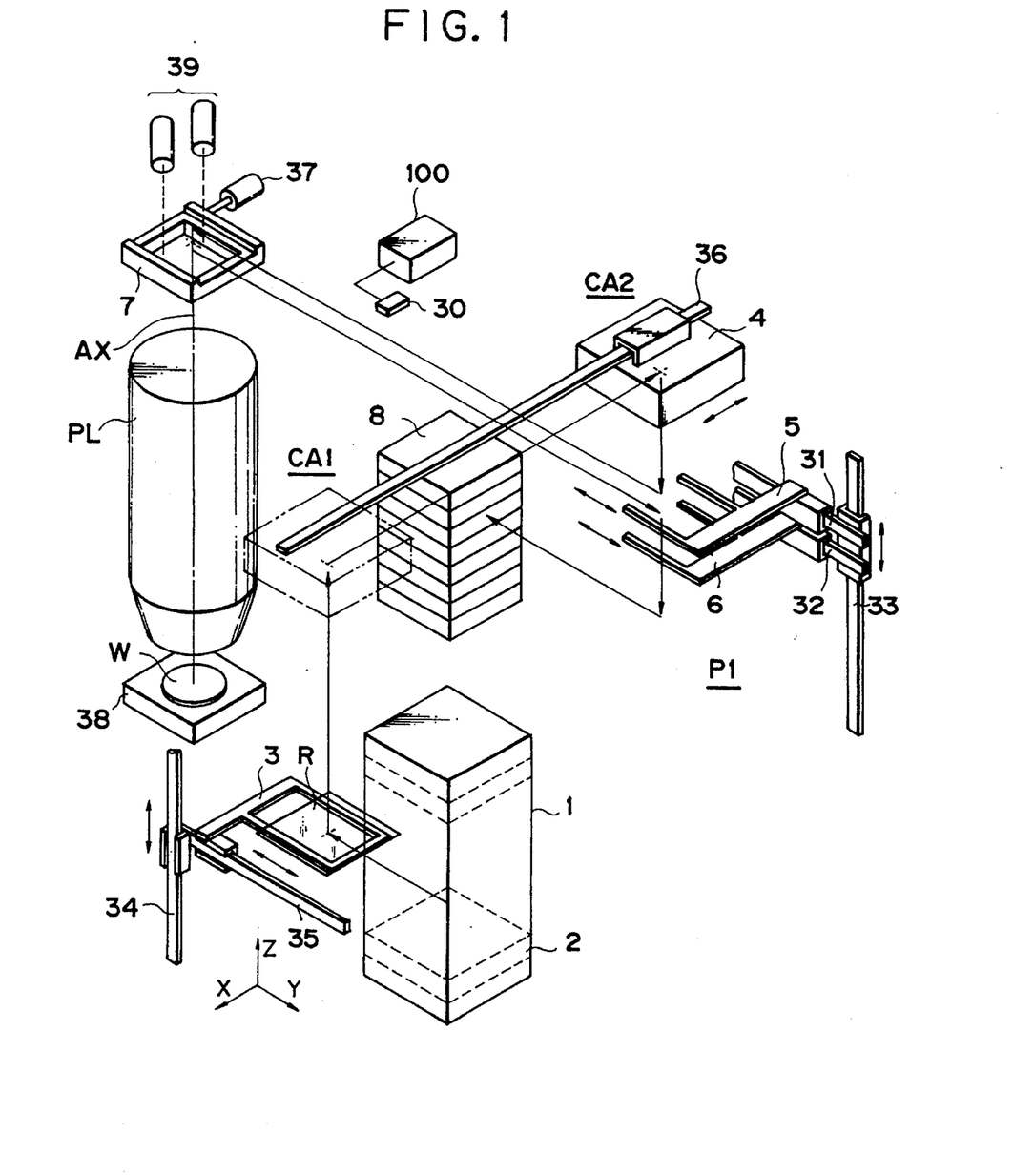
FIG. 1 is a view schematically illustrating a construction of an apparatus for carrying a substrate in one embodiment of the present invention.

One embodiment of an apparatus for carrying a substrate according to the present invention will hereafter be described with reference to FIG. 1. FIG. 1 is a perspective view schematically illustrating the substrate carrying apparatus. The same members as those in FIG. 7 are marked with like numerals.

The substrate carrying apparatus in this embodiment is constructed of a substrate storage part 1, a carrier arm 3, a carrier 4, a load arm 5, an unload arm 6, a temporary storage shelf 8 and a reticle stage 7. The substrate storage part 1 stores a plurality of substrate casings 2 receiving reticles R. The carrier arm 3 is movable in a direction Y through a slider 35. The carrier arm 3 is also movable in a direction Z through a slider 34. The carrier arm 3 takes only a reticle R out of a substrate casing 2 in the substrate storage part 1 and carries the reticle R to a carry position CA1. The carry position CA1 is a position where the reticle R is delivered from the carrier arm 3 to the carrier 4. The carrier arm 3 is formed with a vacuum adsorption hole. The reticle R is held and released by turning ON and OFF an unillustrated vacuum pump. The carrier 4 is movable in a direction X through a slider 36. The carrier 4 has an adsorption hole formed in a lower part thereof. The reticle R is held and released by turning ON and OFF an unillustrated vacuum pump. Further, the carrier 4 includes a prealignment mechanism having four fiducial sides. The reticle R is caught in from two directions orthogonal to each other on the basis of these four sides, thus effecting a prealignment. The carrier 4 prealigns the reticle R and simultaneously carries the reticle R to a position CA2 from the position CA1.

The load arm 5 is movable in the direction Y through a slider 31. The unload arm 6 is movable in the direction Y through a slider 32. Further, the load arm 5 and the unload arm 6 are also movable in a direction Z through a slider 33. The load arm 5 and the unload arm 6 are individually movable in the direction Y but move together in the direction Z. The load arm 5 and the unload arm 6 are, as in the carrier arm 3, formed with adsorption holes. These arms are capable of adsorptively holding and releasing the reticle R by turning ON and OFF a vacuum pump (not shown).

The reticle stage 7 is mounted with the reticle R for an exposure. The reticle stage 7 is provided above a projection optical system PL. The reticle R is carried onto the reticle stage and then located. A position detecting optical system 39 detects an alignment mark formed on the reticle R, thus measuring a position of the reticle R. Positional information of the reticle R is given from the position detecting optical system 39 and transmitted to a main control system 100. The main control system 100 controls a motor 37. The main control system 100 locates the reticle stage 7 with the aid of the motor 37 so that an optical axis AX of the projection optical system PL coincides with the center of the reticle R. The main control system 100 is herein capable of measuring a position of the reticle stage 7 from, e.g., a rotational quantity of the motor 37. The apparatus shown in FIG. 1 is provided with a bar code reader 30 for reading bar codes (not shown) formed on the reticle R. This bar code information is transmitted to the main control system 100. Pieces of identifying information (designations) of the reticles R are recorded in the bar codes. A sequence for selecting a plurality of reticles R is registered beforehand in the apparatus shown in FIG. 1. Based on the information of the bar codes information and the reticle information registered, it is possible to confirm whether or not the reticle R to be selected is correctly carried. Based on the identifying information of the reticle R, it is also feasible to count the number of times with which the same reticle R is carried. Further, pattern information and exposure conditions are recorded in the bar codes. The pattern information is utilized for setting the exposure conditions when forming an image of a pattern of the reticle on a wafer W placed on a two-dimensionally movable wafer stage 38 through the projection optical system PL.

The load arm 5 and the unload arm 6 cooperate to move the reticle R between the reticle stage 7 and the temporary storage shelf 8. The reticles R are, however, carried to the temporary storage shelf 8 by the unload arm 6 up to a termination of a lot size of the reticles R to be used. The temporary storage shelf 8 is positioned between the position CA2 and the reticle stage 7. Hence, a carry time is smaller than in the carry of the reticle R from the substrate storage part 1 to the reticle stage 7.

The main control system 100 controls driving of the reticle stage 7 and the wafer stage 38 as well as driving of the carrier arm 3, the carrier 4, the load arm 5 and the unload arm 6. The main control system 100 also generalizes the whole apparatus by performing a central management about the information given from the bar code reader 30 described above, the sequence to carry the reticles R, the ON/OFF vacuum control and the exposure conditions.

Figure 2A:
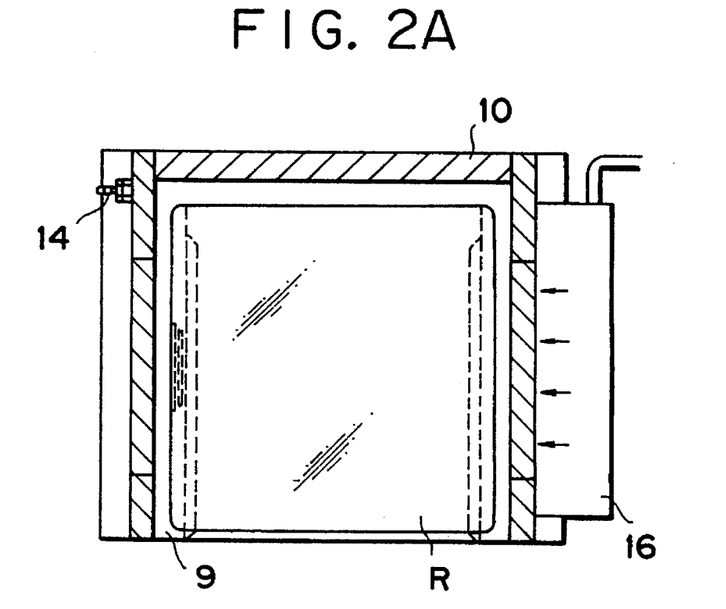
FIGS. 2A and 2B are views each showing an outline of a temporary storage shelf in one embodiment of the present invention.
Figure 2B:
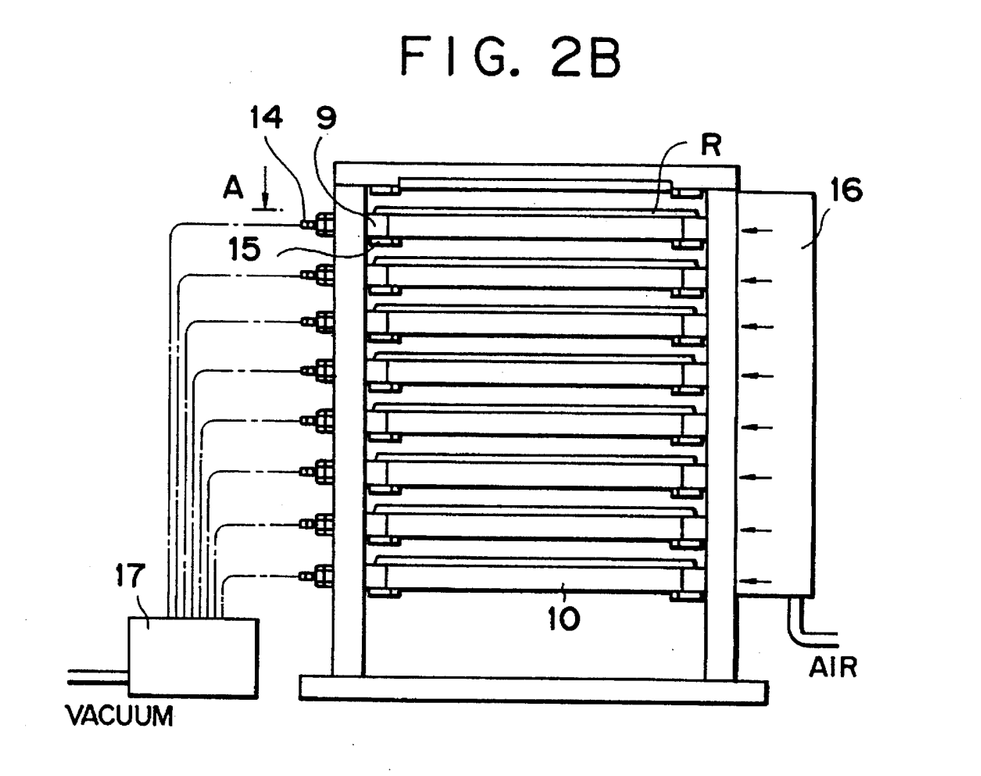
Figure 3:
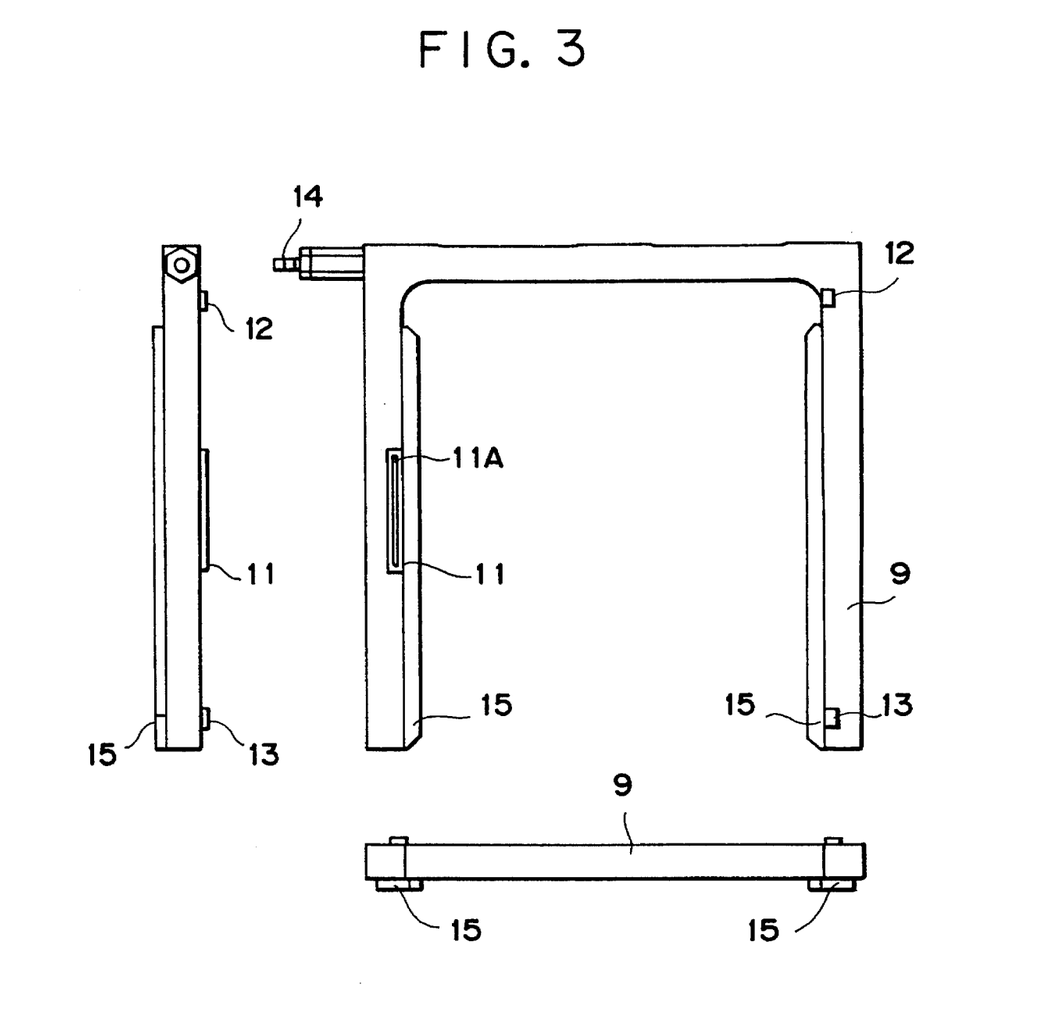
FIG. 3 is a view showing an adsorptive holding member of the temporary storage shelf in one embodiment of the present invention.

The following is an explanation of a structure of the temporary storage shelf 8 with reference to FIGS. 2A, 2B and 3. FIG. 2B is a front view of the temporary storage shelf 8. FIG. 2A is a view showing the temporary storage shelf 8 in section in the direction A in FIG. 2B of an upper surface (arrowed direction). Referring to FIGS. 2A and 2B, the temporary storage shelf 8 has a plurality (eight pieces in this embodiment) of substrate adsorbing members 9 each assuming a substantially C-shape. The adsorbing members 9 are fixed to a rear part 10 of the storage shelf 8 with a parallelism kept with each other. Each substrate holding member 9 adsorptively holds a reticle R in the temporary storage shelf 8.

As illustrated in FIG. 3, the substrate adsorbing member 9 has seat surfaces 11, 12, 13 each protruding by a trace quantity from the substrate adsorbing member. These seat surfaces 11, 12, 13 serve as contact surfaces with the reticle R. The seat surface 11 is formed with an air hole for vacuum adsorptive holding. The air hole of the seat surface 11 is vacuumized, thereby fixing the position of the reticle R. The air hole communicates with a pipe joint 14. The pipe joint 14 is connected to a pneumatic control unit 17 (FIGS. 2A and 2B) capable of independently adsorbing the same number of substrates as that of the substrate holding members 9 (corresponding to the number of substrates storable in the storage shelf 8). Each substrate can be thereby held in a predetermined position. Further, each substrate holding member 9 is provided with a partition plate 15. The partition plate 15 prevents the reticle R from being damaged when the arm contacts another reticle R due to a malfunction of the arm.

Now, referring back to FIGS. 2A and 2B, a clean filter 16 is provided on the side surface of this temporary storage shelf 8. The clean filter 16 is capable of supplying, as indicated by arrows, the air to the interior of the temporary storage shelf 8. A cleanness of environment ambient to the substrates stored therein can be thereby further enhanced.

Figure 4:
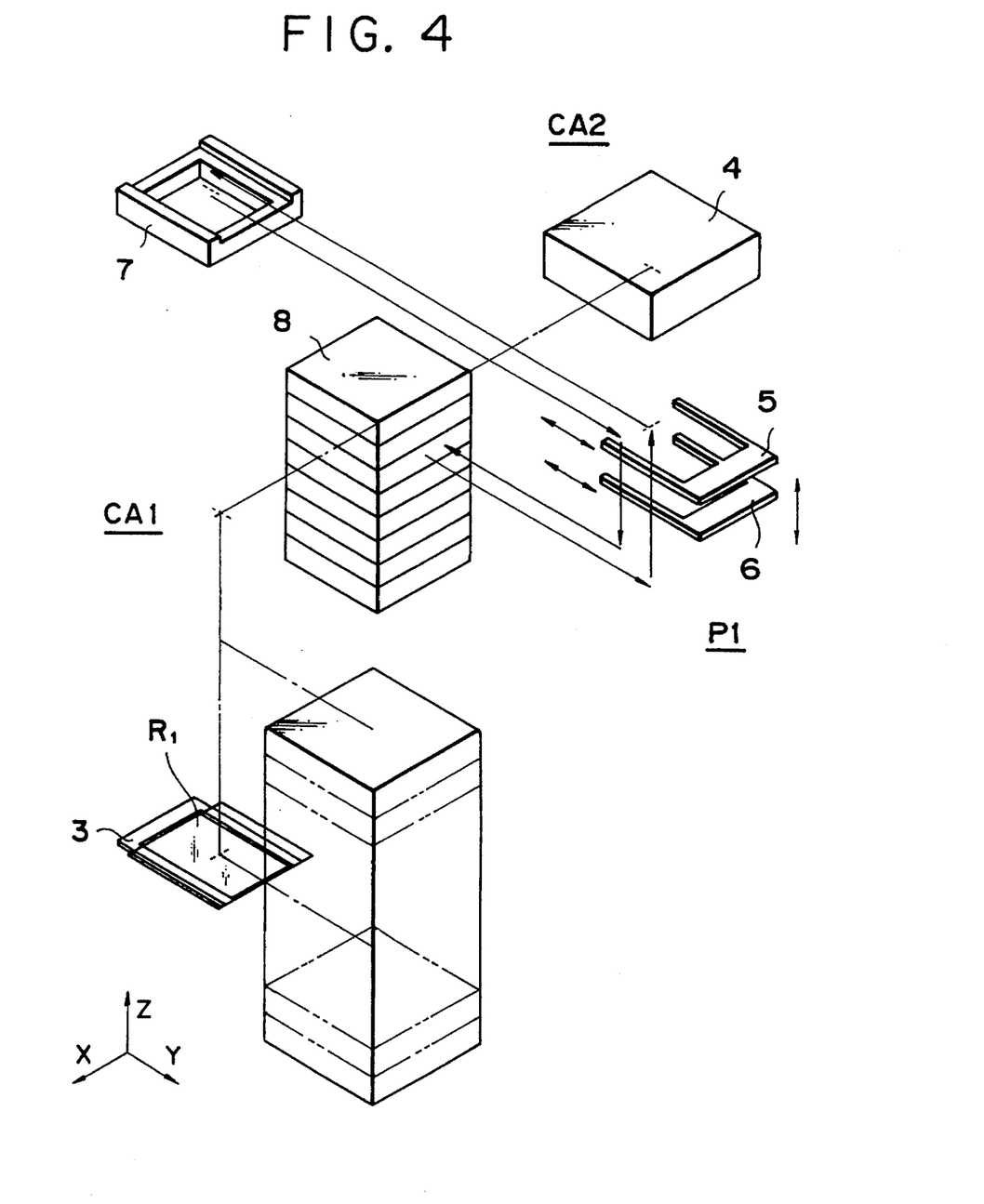
FIG. 4 is a view illustrating how a carry between the temporary storage shelf and a reticle stage is conducted in one embodiment of the present invention.
Figure 5:
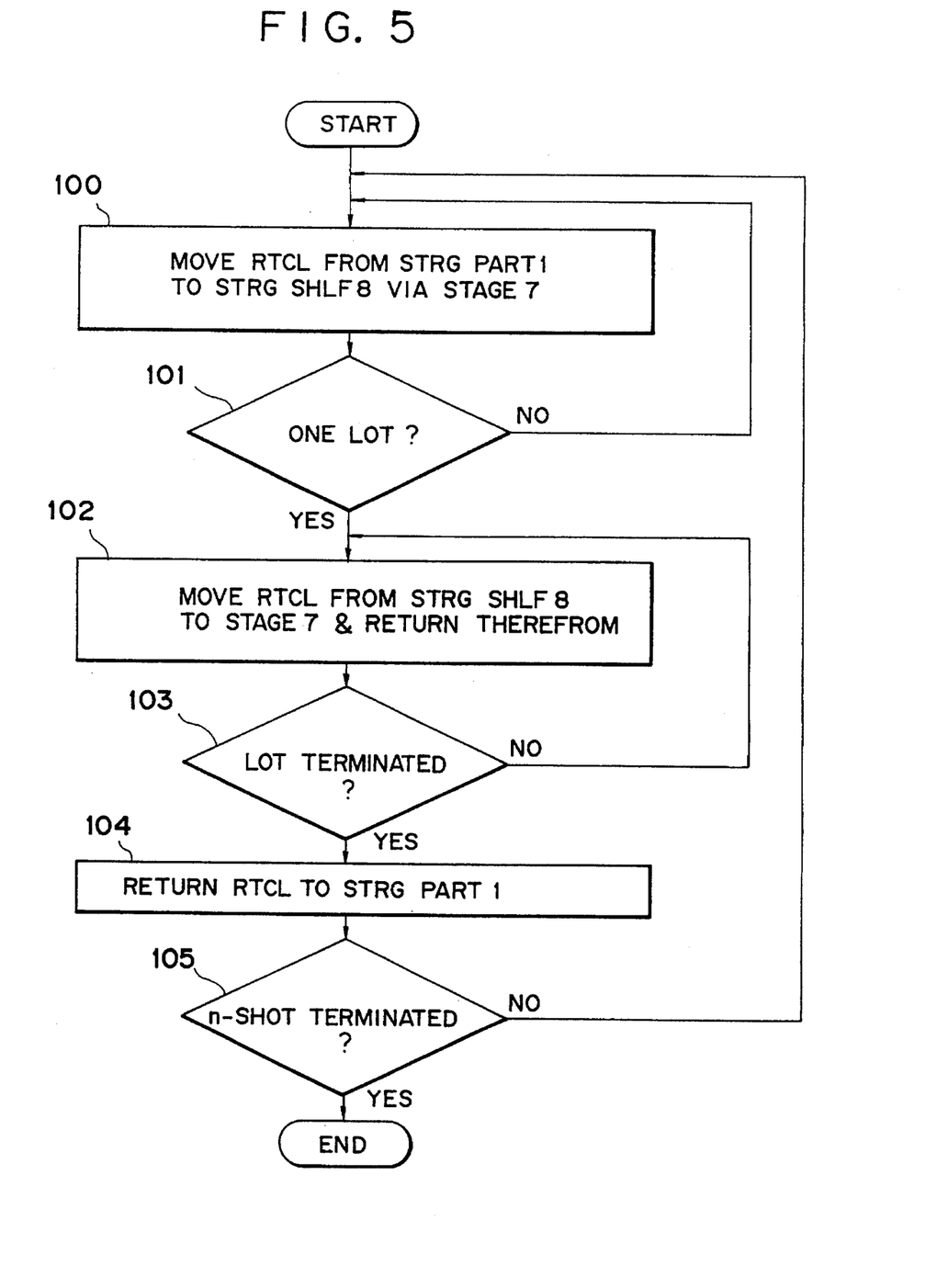
FIG. 5 is a flowchart showing carry operations in one embodiment of the present invention.

Next, a replacement of the substrates in one embodiment of this invention will be explained with reference to FIGS. 1, 4 and 5. FIG. 4 is a view partially illustrating the apparatus of FIG. 1. FIG. 5 is a flowchart showing one example of the replacement of substrates. In accordance with this embodiment, it is assumed that each reticle pattern is transferred onto a single wafer by a step-and-repeat action by using each of the plurality of reticles.

It is herein presumed that eight kinds of reticles ($R_1 \sim R_8$) are employed for one lot in this embodiment.

Step 100

In FIGS. 1 and 4, the reticle $R_1$ is taken by the carrier arm 3 out of the substrate storage part 1. The carrier arm 3 carries the reticle $R_1$ to the position CA1. The carrier arm 3 delivers the reticle $R_1$ to the carrier 4. The delivery is conducted by turning ON a vacuum of the carrier 4 but turning OFF a vacuum of the carrier arm 3.

Next, the carrier 4 carries the reticle $R_1$ to the position CA2 and simultaneously prealigns the reticle $R_1$. The load arm 5 receives the reticle $R_1$ from the carrier 4 in a position P1. The delivery is effected by turning ON a vacuum of the load arm 5 but turning OFF the vacuum of the carrier 4. The load arm 5 transfers the reticle $R_1$ to a deliverable position in the direction Z. Then, the load arm 5 moves up to the reticle stage 7 in the direction Y and delivers the reticle $R_1$ onto the reticle stage 7. The main control system 100 turns ON a vacuum of the reticle stage 7 but turns OFF the vacuum of the load arm 5, whereby the reticle $R_1$ is delivered onto the reticle stage 7 from the load arm 5. The load arm 5 retreats, after delivery, to a position enough not to hinder the exposure. The load arm 5 and the unload arm 6 move together in the direction Z after an exposure. The unload arm 6 moves, when raised up to a reticle $R_1$ receivable position in the direction Z, in the direction Y to receive the reticle $R_1$. Then, the unload arm 6 moves together with the load arm 5 in the direction Z up to a position where the reticle $R_1$ is deliverable to the temporary storage shelf 8. The unload arm 6 moves in the direction Y and enters between the substrate holding members 9. The unload arm 6 transfers the reticle $R_1$ to a predetermined position in the temporary storage shelf 8. The reticle $R_1$ is delivered to the substrate holding member 9 by the vacuum ON/OFF operations described above. An error in terms of delivering the reticle R is small for a precision required by the apparatus and is therefore ignorable in the delivery of the reticle R on the basis of the vacuum ON/OFF operations as in this embodiment. Hence, the reticle R carried is adsorptively held in the temporary storage shelf 8 while keeping a position of alignment on the reticle stage 7 (a position of prealignment if the prealignment by the carrier 4 satisfies an alignment precision required by the apparatus).

Step 101

The main control system 100 judges whether or not a necessary number of reticles R for one lot have been carried to the temporary storage shelf 8. At this time, if the necessary number (8 pieces) for one lot is not reached, the reticle $R_2$ to be used next is delivered in the same manner as the above-mentioned to the load arm 5 via the carrier arm 3 and the carrier 4. The load arm 5 transfers the reticle $R_2$ onto the reticle stage 7. The unload arm 6 transfers the reticle $R_2$ into the temporary storage shelf 8 in the same way as that in step 100. At this moment, the reticle $R_2$ is transferred to an arbitrary substrate holding member 9 other than the substrate holding member 9 which holds the reticle $R_2$. Similarly, the reticles $R_3 \sim R_8$ are stored in the temporary storage shelf 8.

When reaching the necessary number for one lot, the operation moves to step 102.

Step 102

The necessary number of reticles R are all stored in the temporary storage shelf 8, and hence the reticles R are transferred only between the temporary storage shelf 8 and the reticle stage 7 (see FIG. 4).

A carry of the reticle $R_1$ will be explained by way of one example. During a use of the reticle $R_8$ for exposure, the load arm 5 moves together with the unload arm 6 up to the deliverable position of the reticle $R_1$ in the direction Z and takes the reticle $R_1$ out of the temporary storage shelf 8. Then, the load arm 5 moves together with the unload arm 6 in the direction Z. The load arm 5 thereafter moves in the direction Y and transfers the reticle $R_1$ up to the vicinity of the reticle stage 7. Upon a termination of exposure by use of the reticle $R_8$, the unload arm 6 moves in the direction Y. The unload arm 6 thereafter moves in the direction Z and unloads the reticle $R_8$ from the reticle stage 7. Next, the load arm 5 moves in the direction Y and delivers the reticle $R_1$ onto the reticle stage 7. Then, during the use of the reticle $R_1$ for exposure, the unload arm 6 returns the reticle $R_8$ to the temporary storage shelf 8 from the reticle stage 7 in the same manner as that in step 100 discussed above. Then, the load arm 5 holds the reticle $R_2$ in a standby state in close proximity to the reticle stage 7. When the exposure of the reticle $R_1$ has been finished, the reticle $R_2$ is delivered onto the reticle stage 7 as in the case of the reticle $R_1$. Similarly, the reticles $R_2 \sim R_8$ are reciprocated between the temporary storage shelf 8 and the reticle stage 7.

Step 103

The next action is to judge whether or not all the wafers to be processed by use of the reticles $R_1$~$R_8$ have been processed (the lot has been terminated). If the lot has not yet been terminated, the operation returns to step 102. Whereas if terminated, the operation proceeds to step 104.

Step 104

The reticles R after the exposure has been finished are returned to the substrate storage part 1 by operations reversed to those in step 100.

Step 105

Generally, the wafer undergoes an overlay exposure a plurality of times (e.g., m-times) by employing plural kinds of reticles. Hence, whether the m-times exposure has been terminated or not is judged. If the exposure is not yet performed m-times, the operation returns to step 100. The reticles for the second exposure are carried from the substrate storage part 1. Whereas if performed m-times, the carry of the substrate is herein finished.

The replacement of the substrate comes to an end through the steps described above. Note that the reticles $R_1$~$R_8$ are sequentially processed for one wafer in the above-mentioned steps. However, a reticle placed on the reticle stage 7 when processing of eight pieces of reticles is finished may be employed for exposure continuously after a wafer replacement. Namely, after processing the reticles $R_1$~$R_8$, the exposure is effected by using the reticle $R_8$ once again after the wafer replacement. The exposure is conducted in the sequence such as the reticle $R_8$, the reticle $R_1$, the reticle $R_2$ ... the reticle $R_7$. Then, the next wafer may also undergo the exposure in the sequence such as the reticle $R_7$, the reticle $R_8$, the reticle $R_1$ ... the reticle $R_6$.

Further, the operational explanation has been given in step 102 on the assumption that the reticles $R_1$~$R_8$ are stored in the temporary storage shelf 8. The same carrying actions may be performed during the exposure of a reticle carried directly from the substrate storage part 1 and during the carry of a reticle in the temporary storage shelf 8 (e.g., when carrying the reticle $R_1$ in the temporary storage shelf 8 during the exposure of the reticle $R_8$ carried directly from the substrate storage part 1).

Herein, the temporary storage shelf 8 incorporates the mechanism 11 (FIG. 3) for adsorbing each substrate. It is therefore possible to store a reticle R while keeping the position where the alignment is effected on the reticle stage 7. Further, as discussed above, the substrate is adsorptively held in the load arm 5, the unload arm 6, the reticle stage 7 and the temporary storage shelf 8. The substrate that has been once aligned on the reticle stage 7 does not shift in position even when repeatedly carrying the substrate.

The slider 31 serving as a carrier shaft of the load arm 5 is different from the slider 32 serving as a carrier shaft of the unload arm 6 (the load arm 5 and the unload arm 6 have independent carrier shafts). Hence, it can be considered that the carry positions of the reticles R by means of the respective arms have a trace amount of error.

For instance, even when the center of a reticle R coincides with the optical axis AX of the projection optical system PL on the reticle stage 7, the unload arm 6 has a trace amount of carry error in some cases. Hereupon, the central position of a reticle R shifts by a trace quantity from the position of the optical axis AX when carrying the reticle R to the temporary storage shelf from the reticle stage 7.

Concretely, the reticle R unloaded from the reticle stage 7 to the temporary storage shelf 8 by the unload arm 6 is carried from the temporary storage shelf 8 to the reticle stage 7 by the load arm 5. In consideration of this action, as explained before, the reticle R is adsorptively held during the carry and transfer in each position. For this reason, the position of the reticle R does not shift. If the carry position infinitesimally shifts in the fixed direction between the unload arm 6 and the load arm 5, however, it follows that the central position of the reticle R on the reticle stage 7 shifts by a carry error from the position of the optical axis AX. When repeatedly replacing the reticles R in such a state, errors in the reticles R are cumulative. An elimination of these errors may involve the prealignment effected by use of the above-mentioned carrier 4. At this time, the prealignment may be conducted by the carrier 4 when returning the reticle R to the temporary storage shelf 8 from the reticle stage 7. Alternatively, the prealignment may be effected every time the reticle is carried a predetermined number of times.

There are, however, increments both in a prealignment frequency and in a carry time. Further, as stated before, the alignment is performed on the reticle stage 7 every time the reticle R is carried to the reticle stage 7. For this reason, when effecting a fine alignment between the reticle center and the optical axis AX on the reticle stage 7, a moving quantity of the reticle stage 7 increases. It therefore takes much time for the alignment. If a shift quantity further augments, the alignment can not be done.

Hereupon, there will be given an explanation of a case where a reticle is carried in consideration of the shift quantity caused when carried. The following is a brief description of this method. A shift quantity (offset quantity) when a reticle is carried is fed back onto the reticle stage 7 when the reticle carried next time. The reticle stage 7 is moved beforehand by the offset quantity. Then, the load arm 5 delivers the reticle R onto the reticle stage 7 that has been previously moved. At this moment, the center of the reticle stage 7 is aligned with the center of the reticle R with no deviation quantity. After the load arm 5 has retreated, the reticle stage 7 moves by an offset quantity toward the fiducial position (where the center of the reticle R coincides with the optical axis AX) while adsorptively holding the reticle R. Since the fine alignment has been executed during the exposure of the last time, ideally the center of the reticle R substantially coincides with the optical axis AX in this state. The alignment time of the reticle is thereby shortened.

Figure 6:
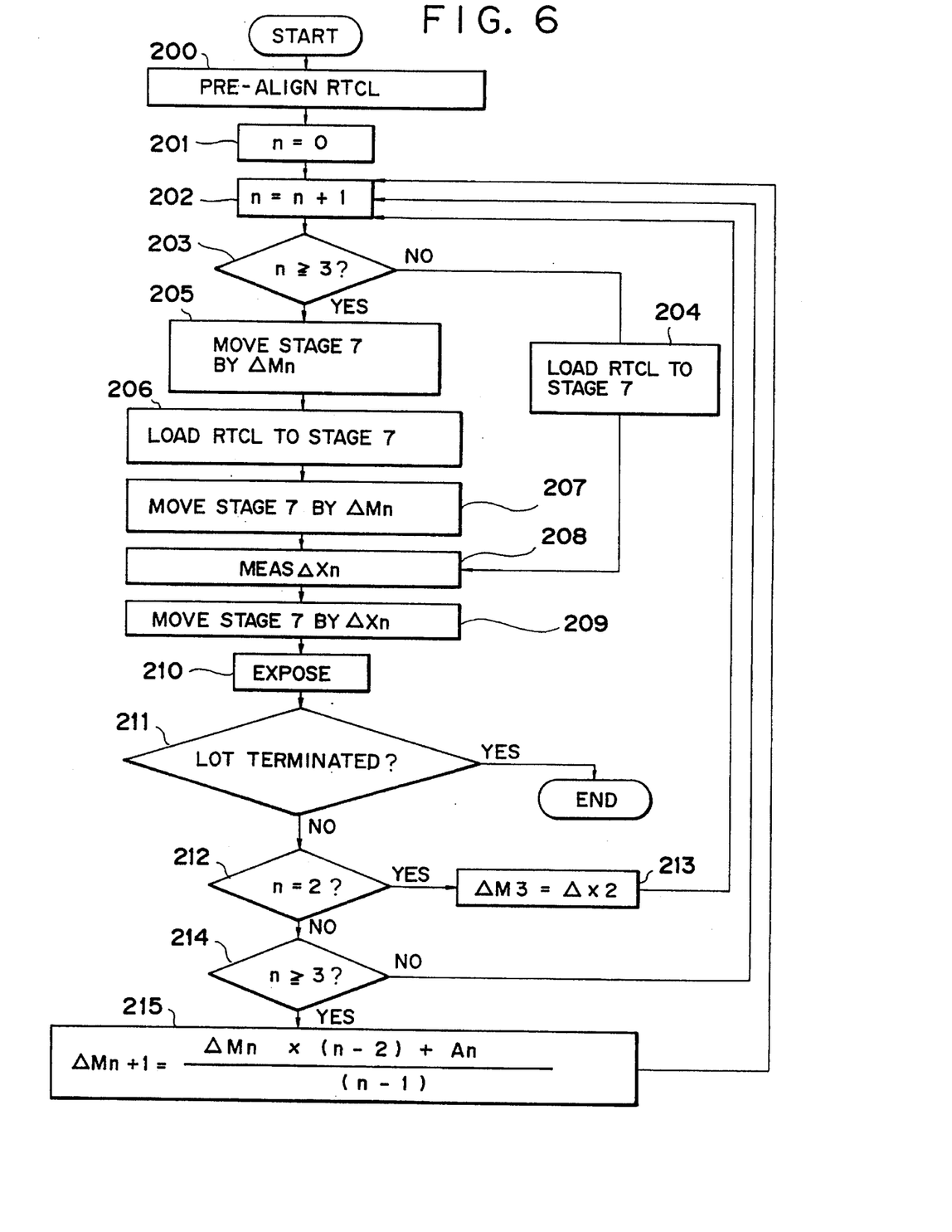
FIG. 6 is a flowchart showing the carry operations in consideration of a carry error in one embodiment of the present invention.

The following is a description of one example of a method of corresponding to a carrier shift without performing the prealignment by use of the carrier 4, with reference to FIG. 6. FIG. 6 is a flowchart showing the method of corresponding to the carry deviation without effecting the prealignment. Incidentally, it is assumed that the reticle stage 7 is located in the fiducial position described above in an initial state. Further, the reticle is confirmed by the bar code reader 30 in FIG. 6, and the number of carries to the reticle stage is measured.

Step 200

The reticle R is carried by the carrier 4. The carrier 4 prealigns the reticle R.

Step 201

When prealigned, a reticle carry number counter in the main control system 100 is reset to zero (n= 0: n herein indicates the carry number).

Step 202

The bar code reader 30 counts the carry number of the reticle R before the reticle R is carried to the reticle stage 7.

Step 203

If the carry number n is 3 or more, the operation proceeds to step 205. Whereas if the carry number is less than 3, the operation proceeds to step 204.

Step 204

The load arm 5 sets the reticle R on the reticle stage 7, and the operation proceeds to step 208.

Step 208

The position detecting optical system 39 measures a deviation ($\Delta x$, $\Delta y$) of the center of the reticle R from the optical axis AX. For convenience, only a deviation quantity $\Delta xn$ in the direction X will be explained.

The main control system 100 stores the positional deviation quantity $\Delta xn$.

The main control system 100 moves the reticle stage 7 by $\Delta xn$ so that the center of the reticle R coincides with the optical axis AX. The main control system 100 stores the position of the reticle stage 7 as a fiducial position at this time.

Step 210

Exposing is executed under the generalized control of the main control system. After an end of exposure, the unload arm 6 carries the reticle R out of the reticle stage 7.

Step 211

Judged is whether or not a wafer lot to be processed comes to a termination. If judged to be terminated, the reticle R is carried to the substrate storage part 1. Whereas if the lot is judged to be unterminated, the operation proceeds to step 212.

Step 212

If the carry number of the reticle R is 2, the operation proceeds to step 213. Whereas if not, the operation proceeds to step 214.

Step 213

The main control system 100 stores an offset quantity $\Delta M3$ caused when the reticle R is carried a third time to the reticle stage 7 as a moving quantity $\Delta xn$ ($\Delta x2$) of the reticle stage 7 in step 209. Then, the operation returns to step 202 wherein the counter is incremented by 1.

Step 214

If the carry number of the reticle R is 3 or more in step 214, the operation proceeds to step 215. In cases other than this, the operation returns to step 202.

Step 215

The main control system 100 calculates an offset quantity $\Delta Mn+1$ in the case of carrying the reticle R (n+1)-th time (next to the carry of the n-th time). The offset quantity $\Delta n+1$ is obtained by averaging a total sum of the offset quantities ($\Delta M3$, $\Delta M4$, ... $\Delta Mn$) given so far and an offset quantity $An$ (a sum of the reticle stage moving quantity $\Delta Mn$ in step 207 and the stage moving quantity $\Delta xn$ in step 209) of the reticle stage position provided with an offset in the n-th carry from the fiducial position. Namely, the offset quantity $\Delta Mn+1$ is obtained by averaging the total sum of the offset quantities including the offset quantity $An$ of this time (n-th time).

This offset quantity is expressed in the following equation:

$$\Delta Mn+1=[\Delta Mn \times (n-2)+An]\div(n-1)$$

(where $An=\Delta Mn+\Delta xn$). This offset quantity $\Delta Mn+1$ is stored in the main control system 100, and the operation returns to step 202.

With the operations discussed above, it is possible to attain the carry of the substrate to cause no positional deviation due to the error in the carrying system without performing the prealignment. When averaging the offset quantities herein, a total sum of the offset quantities in only several carries in the past can be used. Note that the explanation has dealt with only the deviation quantity in the direction X in steps 200 to 215. However, a deviation quantity in the direction Y is similarly obtained. The reticle stage 7 may be likewise moved beforehand by the offset quantity in the direction Y.

Further, the load arm 5 may be constructed to be movable in the directions X, Y. A reticle R may be carried to the reticle stage 7 with a movement of the load arm 5 by offset quantities (the offset quantities both in the direction X and in the direction Y).

Besides, the offset quantity of the last time may be used directly as a next offset quantity. In this case, the offset quantity varies with a passage of time. Hence, the deviation quantity $\Delta xn$ obtained in step 209 may be added to the offset quantity to obtain a new offset quantity. That is, the offset quantity of the last time may be sequentially updated by the deviation quantity $\Delta xn$ obtained in step 209. In addition, the carry number in step 201 may serve as a carry number from the temporary storage shelf 8.

Furthermore, the offset quantities described above are individually managed per reticle. The operations in steps 202–215 may be, however, performed in the sequence of the reticles to be carried without discriminating the respective reticles ($R_1 \sim R_8$) needed.

Further, in the operations described above, the exposure is at first conducted by use of a reticle R carried from the substrate storage part 1. Thereafter, the reticle R is stored in the temporary storage shelf 8. At the first onset, however, a necessary number of reticles R are stored in the temporary storage shelf 8 via the carrier arm 3, the carrier 4 and the load arm 5 (or the unload arm 6). Then, the operations from above-mentioned step 103 onward may be effected.

Additionally, if the temporary storage shelf is provided with an alignment mechanism, the substrate can be always stored in the storage shelf 8 without causing any positional deviation. The alignment mechanism may be constructed such that, for example, an external wall of the temporary storage shelf 8 is formed with an opening, and the substrate is caught from two directions on the basis of edge sides thereof. The alignment mechanism performs aligning in the temporary storage shelf 8.

Further, in the description given above, the load arm 5 and the unload arm 6 move together in the direction Z but may be individually movable. Because of being individually movable, the unload arm puts the reticle into the temporary storage shelf 8 in, e.g., step 100 described above. During this action, the load arm is capable of carrying the reticle to the reticle stage 7, thereby improving a throughput. Besides, the load arm 5 and the unload arm 6 are thus constructed to be individually movable in the direction Z, whereby the moving quantities of the arms can be reduced.

What is claimed is:

1. An apparatus for carrying a substrate comprising:

a substrate storage part for storing a plurality of substrate casings capable of encasing a plurality of substrates, respectively;

a substrate stage for holding a substrate by a suction vacuum;

a first carrier system capable of taking a substrate from, or into, one of said plurality of substrate casings stored in said substrate storage part, and of carrying a taken substrate between said substrate storage part and a substrate carry position;

a temporary storage unit provided on a substrate carrying path between said substrate carry position and said substrate stage, and having a plurality of sucking mechanisms for concurrently holding a plurality of substrates by a suction vacuum; and a second carrier system for carrying a substrate between said substrate carry position or said temporary storage part and said substrate stage while holding a carried substrate by a suction vacuum.

2. An apparatus according to claim 1, further comprising:

a detecting system for detecting a substrate carrying shift occurring within at least one substrate carry between said temporary storage part and said substrate stage;

a moving mechanism for adjusting a relative position between said substrate stage and said second carrier system; and a controller for controlling said moving mechanism based on the substrate carrying shift.

3. An apparatus according to claim 1, further comprising an air supplying system for supplying clean air into said temporary storage part.

4. An apparatus according to claim 1, further comprising an aligning portion for performing a prealignment of a substrate to said substrate carry position.

5. An apparatus for carrying a substrate comprising:

a temporary storage part having a plurality of sucking mechanisms for concurrently holding a plurality of substrates by a suction vacuum;

a substrate stage for holding one of said plurality of substrates by a suction vacuum;

a carrier system for holding a substrate by a suction vacuum and carrying a held substrate between said temporary storage part and said substrate stage;

a detecting system for detecting a substrate carrying shift occurring within at least one substrate carry between said temporary storage part and said substrate stage;

a moving mechanism for adjusting a relative position between said substrate stage and said carrier system; and a controller for controlling said moving mechanism based on the substrate carrying shift.

6. An apparatus according to claim 5, wherein said moving mechanism includes a driving portion for minutely moving said substrate stage two-dimensionally, and said controller controls said driving portion in accordance with the substrate carrying shift to move said substrate stage.

7. An apparatus according to claim 5, wherein said carrier system includes a load arm for taking a substrate onto said substrate stage and an unload arm for taking a substrate from the substrate stage, and said detecting system detects a substrate carrying shift between said load arm and said unload arm when a substrate is carried between said temporary storage part and said substrate stage.

8. An apparatus for exposing a pattern formed on a reticle, onto a photosensitive object, comprising:

a reticle stage for holding the reticle by a suction vacuum;

a reticle case storage part for storing a plurality of reticle cases capable of encasing a plurality of reticles, respectively;

a first carrier system capable of taking a reticle from, or into, one of said plurality of reticle cases stored in said reticle case storage part, and of carrying a taken reticle between said reticle case storage part and a reticle carry position;

a temporary storage unit provided on a reticle carrying path between said reticle carry position and said reticle stage, and having a plurality of sucking mechanisms for concurrently holding a plurality of reticles by a suction vacuum; and a second carrier system for carrying a reticle between said reticle carry position or said temporary storage part and said reticle stage, while holding a carried reticle by a suction vacuum.

* * * * *